(12) United States Patent
Abys et al.

(10) Patent No.: US 8,703,243 B2
(45) Date of Patent: *Apr. 22, 2014

(54) ANTI-TARNISH COATINGS

(75) Inventors: Joseph A. Abys, Guilford, CT (US);
Shenliang Sun, Bethany, CT (US);
Theodore Antonellis, Bethany, CT (US)

(73) Assignee: Enthone Inc., West Haven, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/176,411

(22) Filed: Jul. 5, 2011

(65) Prior Publication Data

US 2012/0175022 A1 Jul. 12, 2012

Related U.S. Application Data

(63) Continuation of application No. 11/944,287, filed on Nov. 21, 2007, now Pat. No. 7,972,655.

(51) Int. Cl.
*B05D 3/10* (2006.01)

(52) U.S. Cl.
USPC .......................................... 427/337; 427/343

(58) Field of Classification Search
None
See application file for complete search history.

(56) References Cited

U.S. PATENT DOCUMENTS

| | | | |
|---|---|---|---|
| 3,365,312 A | 1/1968 | Nowack et al. | |
| 3,398,003 A | 8/1968 | Smith et al. | |
| 3,630,790 A | 12/1971 | Schmidt et al. | |
| 4,357,396 A * | 11/1982 | Grunewalder et al. | 428/626 |
| 4,873,139 A | 10/1989 | Kinosky | |
| 6,139,610 A | 10/2000 | Sinko | |
| 6,183,815 B1 | 2/2001 | Enick et al. | |
| 6,375,822 B1 | 4/2002 | Taytsas | |
| 6,395,329 B2 | 5/2002 | Soutar et al. | |
| 6,773,757 B1 | 8/2004 | Redline et al. | |
| 6,905,587 B2 | 6/2005 | Redline et al. | |
| 7,524,535 B2 | 4/2009 | Kim et al. | |
| 7,972,655 B2 | 7/2011 | Abys et al. | |
| 2001/0022989 A1 * | 9/2001 | Soutar et al. | 427/96 |
| 2005/0183793 A1 | 8/2005 | Kim et al. | |
| 2005/0263025 A1 | 12/2005 | Blees | |
| 2007/0001150 A1 | 1/2007 | Hudgens et al. | |

(Continued)

FOREIGN PATENT DOCUMENTS

EP 1029944 B1 3/2010
IN 107625 4/1968

(Continued)

OTHER PUBLICATIONS

Tompkins et al., "The Interaction of Imidazole, Benzimidazole and Related Azoles with a Copper Surface", Surface and Interface Analysis, vol. 4, Issue 6, Dec. 1982, pp. 261-266.

(Continued)

*Primary Examiner* — Erma Cameron
(74) *Attorney, Agent, or Firm* — Senniger Powers LLP

(57) ABSTRACT

A method is disclosed for enhancing the corrosion resistance of a surface of a copper or copper alloy substrate. The method comprises depositing a metallic surface layer comprising a precious metal on a surface of the copper or copper alloy substrate by immersion displacement plating and exposing the electronic device to an aqueous composition comprising a first organic molecule comprising at least one functional group that interacts with and protects precious metal surfaces and a second organic molecule comprising at least one functional group that interacts with and protects copper surfaces.

16 Claims, 10 Drawing Sheets

(56) References Cited

U.S. PATENT DOCUMENTS

| | | |
|---|---|---|
| 2007/0039665 A1 | 2/2007 | Johns et al. |
| 2007/0277906 A1 | 12/2007 | Johns et al. |
| 2008/0096046 A1 | 4/2008 | Yamashita et al. |
| 2008/0261025 A1 | 10/2008 | Abys et al. |
| 2009/0121192 A1 | 5/2009 | Abys et al. |
| 2010/0151263 A1 | 6/2010 | Abys et al. |
| 2010/0319572 A1 | 12/2010 | Abys et al. |

FOREIGN PATENT DOCUMENTS

| | | | |
|---|---|---|---|
| IN | 113506 | | 5/1969 |
| IN | 113506 | * | 1/1970 |
| JP | S56-1396 | | 1/1981 |
| JP | S60251285 | | 12/1985 |
| JP | S60258483 | | 12/1985 |
| JP | H06212491 | | 8/1994 |
| JP | 9-249991 A | | 9/1997 |
| JP | 2002220676 | | 8/2002 |
| JP | 2004238658 | | 8/2004 |
| JP | 2007084875 | | 4/2007 |
| WO | 96/17975 | | 6/1996 |
| WO | 2005/103334 | | 11/2005 |

OTHER PUBLICATIONS

Trachli, B., et al., "Protective Effect of Electropolymerized 2-Mercaptobenzimidazole upon Copper Corrosion", Progress in Organic Coating, 2002, vol. 44, pp. 17-23.
International Search Report, PCT/US08/83912, dated Jan. 5, 2009, 4 pages.
Written Opinion, PCT/US08/83912, dated Jan. 5, 2009, 7 pages.
Xue et al., "Various Adsorption States of 2-Mercaptobenzimida-zole on the Surfaces of Gold and Silver Studied by Surface Enhanced Raman Scattering", Langmuir, vol. 10, No. 3 (1994), pp. 967-969.
Xue et al., "Surface Reaction of 2-Mercaptobenzimidazole on Metals and its Application in Adhesion Promotion", Journal of the Chemical Society, Faraday Transactions, 1991, vol. 87, pp. 1229-1232.
Fields, Ellis, "Preparation of Lubricating Oil Additives from Dimercaptothiadiazole" Ind. Eng. Chem., 1957, 49 (9), pp. 1361-1364.
Abstract of JP9-249991; Sep. 22, 1997.
Extract of Invalidity Contentions Submitted by Assignee Enthone versus U.S. Pat. 6,375,822 in Case No. 3:12-cv-01192-WGY in U.S. District Court Connecticut, Jun. 14, 2013, 15 pages.
Abstract of JPS56-1396; Jan. 13, 1981.
Abstract of JPS60258483; Dec. 20, 1985.
Abstract of JPS60251285; Dec. 11, 1985.

* cited by examiner

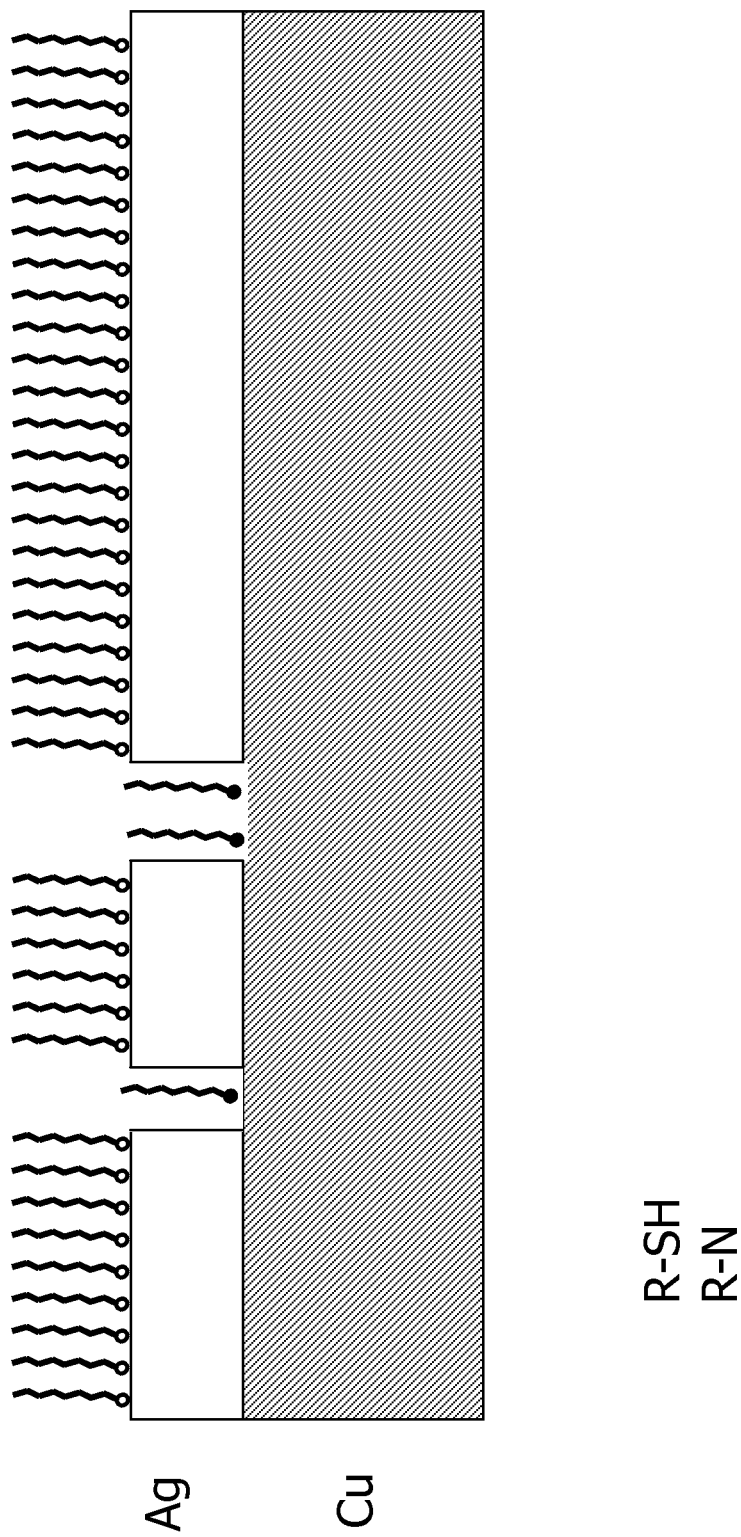

ANTI-TARNISH COATINGS

REFERENCE TO RELATED APPLICATION

This application is a Continuation Application based on U.S. application Ser. No. 11/944,287, filed Nov. 21, 2007, issued Jul. 5, 2011 as U.S. Pat. No. 7,972,655.

FIELD OF THE INVENTION

This invention relates to methods and compositions for enhancing the corrosion protection, solderability, and wear resistance of copper substrates used in the manufacture of electronic and microelectronic devices.

BACKGROUND OF THE INVENTION

Metallic surface coatings are commonly applied to electronic devices and decorative objects to provide corrosion protection and other desired functional properties. Electronic devices comprising copper or copper alloy substrates are typically coated with metallic surface coatings which provide corrosion protection, high surface contact conductivity, and wear resistance. The metallic surface coatings typically comprise precious metals, in particular silver and gold, which provide superior corrosion protection.

For example, in printed circuit board manufacture, a thin layer of silver may be deposited over copper circuitry as a solderability preserver. The silver is generally deposited by an immersion displacement plating, in which silver ions present in the plating composition come into contact with and are reduced by surface copper atoms, according to the following reaction:

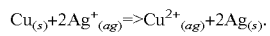
$$Cu_{(s)} + 2Ag^+_{(aq)} \Rightarrow Cu^{2+}_{(aq)} + 2Ag_{(s)}.$$

The reduction-oxidation reaction reduces silver ions to silver metal and forms an adhesive silver layer over the copper substrate. The process is self-limiting in that once the copper surface is covered with a layer of silver, copper atoms are no longer accessible to reduce additional silver ions. Typical thicknesses of silver immersion displacement films over copper can be between about 0.05 and about 0.8 microns. See, for example, U.S. Pat. Nos. 5,955,141; 6,319,543; 6,395,329; and 6,860,925, the disclosures of which are hereby incorporated by reference as if set forth in their entireties.

In the manufacture of copper lead frames and connectors and as an alternative finish in PCB manufacture, gold may be applied as a metallic surface coating over copper substrates for corrosion resistance and increased wear resistance. Typically, gold is not deposited directly on the copper substrate, but rather on an intervening base metal underlayer. The base metal underlayer, typically electrolessly deposited nickel, is deposited on the copper or copper alloy substrate. The base metal serves as a diffusion barrier. The precious metal overlayer, such as gold, palladium, or alloys thereof, is then deposited, typically by an immersion displacement method, over the base metal underlayer coating. The precious metal overlayer provides corrosion resistance, wear resistance, and high conductivity. In the conventional electroless nickel-immersion gold method (commonly referred to as ENIG), an electrolessly deposited nickel underlayer increases the hardness of an immersion plated gold overlayer. This metallic surface is commonly referred to as "nickel-hardened gold" or simply, "hard gold." Variations on these coatings involve base metal alloy underlayers, precious metal alloy overlayers, and metallic surface coatings comprising two or more base metal underlayers and/or two or more precious metal overlayers.

An obvious disadvantage to the use of precious metals such as gold and palladium is cost. A cost effective connector uses a precious metal coating layer which is as thin as possible, without sacrificing the desired functional properties. Accordingly, the industry typically employs precious metal layer on the order of about 1.0 μm thick on electronic connectors. Thinner layers suffer from the disadvantage of highly increased porosity in the coating. Over time in service, the thin layers having a high degree of porosity are ineffective against base metal and copper diffusion to the surface. In a corrosive environment, the exposed base metal and copper will corrode and the corrosion product(s) can migrate onto the coating surface and deteriorate the surface contact conductivity. Moreover, a thin precious metal layer can wear off during application and shorten the connector's useful lifetime.

A particular problem observed with immersion-plated precious metal coatings, e.g., silver and gold, is creep corrosion of copper salts at certain bare copper interfaces between copper and precious metal. For example, immersion silver displacement plating processes may not sufficiently coat copper wiring in PCB, particularly at plated through holes and high aspect ratio blind vias. Corrosion at these locations manifests itself as an annular ring surrounding the vias and plated through holes.

Moreover, silver is susceptible to sulfidation by reduced sulfur compounds (e.g., hydrogen sulfide) present in the environment, particularly at paper processing plants, rubber processing plants, and high pollution environments. Sufficient sulfidation of silver can result in localized pores, which may expose copper to the environment. Humidity and environmental pollutants can oxidize and sulfidize the copper, forming copper salts that may creep through pores in the silver layer.

SUMMARY OF THE INVENTION

In one aspect, the present invention is directed to a method for enhancing the corrosion resistance of a surface of a copper or copper alloy substrate. The method comprises depositing a metallic surface layer comprising a precious metal on the surface of the copper or copper alloy substrate; and exposing the copper or copper alloy substrate having a metallic surface layer thereon to an aqueous composition comprising (a) a first organic molecule comprising at least one functional group that interacts with and protects precious metal surfaces, (b) a second organic molecule comprising at least one functional group that interacts with and protects copper surfaces, and (c) a surfactant.

Other objects and features will be in part apparent and in part pointed out hereinafter.

BRIEF DESCRIPTION OF THE FIGURES

FIG. 1 is an illustration depicting two molecules adhering to and forming a protective organic film on the surfaces of a copper substrate having an immersion-plated silver layer thereon.

DETAILED DESCRIPTION OF EMBODIMENT(S) OF THE INVENTION

Figure 2A:
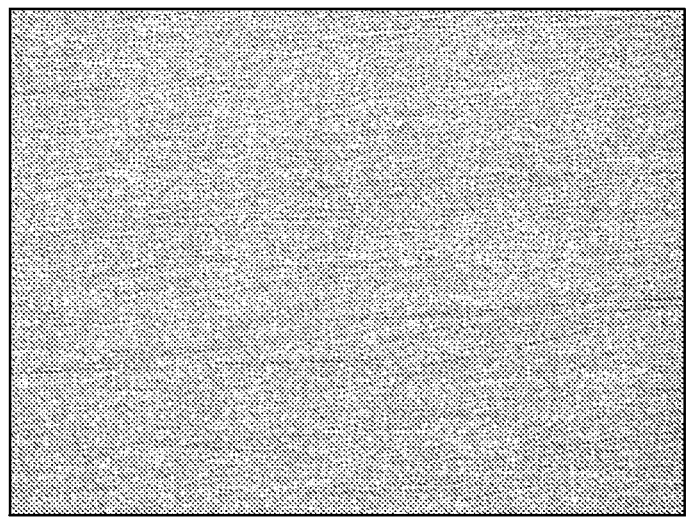
FIGS. 2A through 2D are photographs of an immersion silver-plated copper coupon coated with immersion-plated silver according to the method of Example 1. The silver-plated copper coupon was subjected to porosity testing according to the method of Example 2.

The present invention is directed to a method and composition for applying a protective organic film to a copper substrate having a metallic coating on a surface thereof. In one embodiment, the metallic coating comprises a precious metal. In one embodiment, the method and composition apply a protective organic film to a metallic coating comprising silver. In one embodiment thereof, the metallic coating comprising silver is applied by an immersion displacement plating process. In another embodiment, the method and composition apply a protective organic film to a metallic coating comprising gold. In one embodiment thereof, the metallic coating comprising gold is applied by an immersion displacement plating process.

The protective organic film is particularly suited for use in preserving the solderability of copper or copper alloy substrates having a layer of precious metal thereon. Copper substrates suitable for protection with the organic protective film of the invention include copper circuitry in printed circuit boards, chip carriers, semiconductor substrates, metal lead frames, and other solderable copper substrates. These substrates may be coated with precious metal, in particular with metallic coatings comprising silver, gold, or a combination thereof.

Silver immersion displacement plating is a particularly preferred method of preserving the solderability of copper conductive features and copper plated through holes in printed circuit board (PCB) manufacture. Silver immersion plating is a self-limiting process which yields silver layers having typical thicknesses between about 0.05 microns and about 0.8 microns, typically between about 0.15 microns and about 0.40 microns. Certain immersion processes and compositions can plate silver layers having thicknesses outside the broad range. As stated above, immersion-plated silver may not adequately protect copper surfaces, such as at certain bare copper interfaces between copper and silver, particularly at plated through holes and high aspect ratio blind vias in PCB substrates. Moreover, immersion-plated silver coatings are susceptible to pore formation due to sulfidation and oxidation, particularly in high pollution environments. Accordingly, the present invention is directed to a method of applying a protective organic film to provide a layer of corrosion protection over copper surfaces, in addition to the immersion-plated silver coating. In one embodiment, therefore, the method of applying the protective organic film involves exposing the copper substrate having an immersion-plated silver coating on a surface thereof to a composition for enhancing the corrosion resistance of the immersion-plated silver coating and for maintaining the solderability of the copper conductive lines and copper plated through holes.

The present invention is therefore further directed to such a composition. The composition of the present invention comprises an organic molecule comprising at least one functional group that interacts with and protects precious metal surfaces. In particular, the organic molecule comprises at least one functional group that interacts with and protects silver surfaces, gold surfaces, or a surface comprising both silver and gold. Such an organic molecule is effective for filling pores in the precious metal layer, thereby inhibiting copper creep corrosion, and is effective for covering the surface of the precious metal with a self-assembled protective organic film.

The present invention is further directed to a composition that comprises an organic molecule comprising at least one organic functional group that interacts with and protects copper surfaces. Such an organic molecule is capable of reacting with copper surfaces, thereby forming a self-assembled protective organic film capable of inhibiting exposure to water, environmental humidity, and other pollutants that may corrode copper surfaces.

The present invention is yet further directed to a composition that comprises an organic molecule comprising at least one functional group that interacts with and protects precious metal surfaces and an organic molecule comprising at least one organic functional group that interacts with and protects copper surfaces.

In one embodiment, the organic molecule comprising at least one functional group that interacts with and protects precious metal surfaces comprises a sulfur atom. Functional groups that comprise a sulfur atom include thiols (mercaptans), disulfides, thioethers, thioaldehydes, and thioketones. The composition may comprise a combination of thiols (mercaptans), disulfides, thioethers, thioaldehydes, and thioketones. Without being bound to a particular theory, it is thought that the lone electron pair in the sulfur atom forms a sulfur-precious metal bond, thereby self-assembling a protective organic film over the precious metal coating layer, wherein the film comprises a self-assembled monolayer comprising an organic molecule comprising the sulfur atom bonded to the precious metal surface. In one embodiment, the copper substrate is coated with a silver coating layer deposited by, for example, immersion displacement plating, and the sulfur atom present in the organic molecule forms a sulfur-silver bond. In one embodiment, the copper substrate is coated with a gold coating layer deposited by, for example, immersion displacement plating, and the sulfur atom present in the organic molecule forms a sulfur-gold bond. The sulfur containing compound typically comprises an organic component that enhances the effectiveness of the organic protective film by rendering the film more hydrophobic and thus more capable of repelling water and environmental humidity.

In one embodiment, the organic molecule comprising at least one functional group that interacts with and protects precious metal surfaces is a thiol. Thiols have the following general structure (I):

$R_1$—S—H             Structure (I)

wherein $R_1$ is a hydrocarbyl having from one carbon atom to about 24 carbon atoms, an aryl having from about five to about fourteen carbon atoms, or an arylhydrocarbyl wherein the hydrocarbyl has from one carbon atom to about 24 carbon atoms and the aryl has from about five to about fourteen carbon atoms. The hydrocarbyl preferably comprises between about six carbon atoms and about 18 carbon atoms. The aryl preferably comprises between about four and about ten carbon atoms. The aryl may comprise one five-membered ring or six-membered ring or a fused two-ring system in which the two-rings include a five-membered ring and a six-membered ring or two six-membered rings. The aryl and hydrocarbyl may be substituted or unsubstituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. In one preferred embodiment, the $R_1$ is hydrocarbyl, is not substituted with other groups, and is a straight-chained alkyl, since straight-chained alkyl better achieves a desirable densely packed self-assembled monolayer over the precious metal surface coating. Exemplary alkyl thiols applicable for use in the composition of the present invention include, singly or in combination, ethanethiol; 1-propanethiol; 2-propanethiol; 2-propene-1-thiol; 1-butanethiol; 2-butanethiol; 2-methyl-1-propanethiol; 2-methyl-2-propanethiol; 2-methyl-1-butanethiol; 1-pentanethiol; 2,2-dimethyl-1-propanethiol; 1-hexanethiol; 1,6-hexanedithiol; 1-heptanethiol; 2-ethylhexanethiol; 1-octanethiol; 1,8-octanedithiol; 1-nonanethiol; 1,9-nonanedithiol; 1-decanethiol; 1-adamantanethiol; 1,11-undecanedithiol; 1-undecanethiol; 1-dodecanethiol; tert-dodecylmercaptan; 1-tridecanethiol; 1-tetradecanethiol; 1-pentadecanethiol; 1-hexadecanethiol; 1-heptadecanethiol; 1-octadecanethiol; 1-nonadecanethiol; and 1-icosanethiol.

In another preferred embodiment, the $R_1$ comprises an aromatic ring. Aryl thiols also achieve highly hydrophobic, densely packed self-assembled monolayers over the precious metal surface coating. Exemplary aryl thiols applicable for use in the composition of the present invention include, singly or in combination, benzenethiol; 2-methylbenzenethiol; 3-methylbenzenethiol; 4-methylbenzenethiol; 2-ethylbenzenethiol; 3-ethylbenzenethiol; 4-ethylbenzenethiol; 2-propylbenzenethiol; 3-propylbenzenethiol; 4-propylbenzenethiol; 2-tert-butylbenzenethiol; 4-tert-butylbenzenethiol; 4-pentylbenzenethiol; 4-hexylbenzenethiol; 4-heptylbenzenethiol; 4-octylbenzenethiol; 4-nonylbenzenethiol; 4-decylbenzenethiol; benzyl mercaptan; 2,4-xylenethiol; furfuryl mercaptan; 1-naphthalenethiol; 2-naphthalenethiol; and 4,4'-dimercaptobiphenyl.

In one embodiment, the organic molecule comprising at least one functional group that interacts with and protects precious metal surfaces is a disulfide. Disulfides can be formed by the oxidation of two thiols and can have the following structure (II):

$$R_1-S-S-R_2 \quad \text{Structure (II)}$$

wherein $R_1$ and $R_2$ are each independently a hydrocarbyl having between one carbon atom and about 24 carbon atoms, an aryl having between about five and about fourteen carbon atoms, or an arylhydrocarbyl wherein the hydrocarbyl has from one carbon atom to about 24 carbon atoms and the aryl has from about five to about fourteen carbon atoms. The hydrocarbyl preferably comprises between about six carbon atoms and about 18 carbon atoms. The aryl preferably comprises between about four and about ten carbon atoms. The aryl may comprise one five-membered ring or six-membered ring or a fused two-ring system in which the two-rings include a five-membered ring and a six-membered ring or two six-membered rings. The aryl and hydrocarbyl may be substituted or unsubstituted. The aryl and hydrocarbyl may be substituted or unsubstituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. In one preferred embodiment, the $R_1$ and $R_2$ hydrocarbyls are not substituted with other groups and are straight-chained alkyls, since straight-chained alkyls better achieve a desirable densely packed self-assembled monolayer over the precious metal surface coating. Exemplary disulfides applicable for use in the composition of the present invention include, singly or in combination, diethyl disulfide, di-n-propyl disulfide, diisopropyl disulfide, diallyl disulfide, di-n-butyl disulfide, di-sec-butyl disulfide, diisobutyl disulfide, di-tert-butyl disulfide, di-n-pentyl disulfide, di-neopentyl disulfide, di-n-hexyl disulfide, di-n-heptyl disulfide, di-n-octyl disulfide, di-n-nonyl disulfide, di-n-decyl disulfide, di-n-dodecyl disulfide, di-n-tridecyl disulfide, di-n-tetradecyl disulfide, di-n-pentadecyl disulfide, di-n-hexadecyl disulfide, di-n-heptadecyl disulfide, di-n-octadecyl disulfide, di-n-decyl disulfide; diundecyl disulfide, didodecyl disulfide, dihexadecyl disulfide.

In another preferred embodiment, $R_1$ and $R_2$ comprises an aromatic ring. It is thought that the sulfur-sulfur bond may be broken more easily for aromatic disulfides, such that the sulfur atom is more easily made available for bonding to silver or gold. Aryl thiols also achieve highly hydrophobic, densely packed self-assembled monolayers over the precious metal surface coating. Exemplary aryl thiols applicable for use in the composition of the present invention include, singly or in combination, dibenzyl disulfide, dithienyl disulfide, and 2-naphthyl disulfide.

The organic molecule comprising at least one functional group that interacts with and protects precious metal surfaces may be added to the surface treating compositions of the present invention at a concentration between about 0.01% by weight (about 0.1 g/L) and about 10% by weight (about 100 g/L), preferably between about 0.1% by weight (about 1.0 g/L) and about 1.0% by weight (about 10 g/L). The sulfur containing compound is added to the composition in at least 0.1 g/L to achieve adequate coverage and protection of the surface coating. The maximum concentration of about 100 g/L is an estimate based on the compound's solubility and therefore may be higher or lower than the stated amount depending upon the identity of the sulfur containing compound. In a preferred composition, the organic molecule comprising at least one functional group that interacts with and protects precious metal surfaces is 1-octadecanethiol added in a concentration between about 0.5 g/L and about 10.0 g/L, for example, about 5.0 g/L.

In one embodiment, the organic molecule comprising at least one functional group that interacts with and protects copper surfaces comprises a nitrogen atom. Accordingly, the organic functional group is an amine. An amine is a functional group comprising nitrogen, typically bonded to or part of an organic functional group, such as a hydrocarbyl, an aryl, or an aromatic heterocycle. Applicable amines therefore include primary amines, secondary amines, tertiary amines, and aromatic heterocycles comprising nitrogen. The composition may comprise a combination of amines. Without being bound to a particular theory, it is thought that the lone electron pair in the amine functional group forms a nitrogen-copper bond, thereby forming a protective organic film over the copper conducting layer, wherein the film comprises the nitrogen atom of the amine bonded to the copper surface and the organic substituent.

In one embodiment, the amine is a primary amine, secondary amine, or a tertiary amine having the following general structure (III):

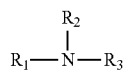

Structure (III)

wherein $R_1$, $R_2$, and $R_3$ are each independently hydrogen or a hydrocarbyl having between one carbon atom and about 24 carbon atoms, and at least one of $R_1$, $R_2$, and $R_3$ is a hydrocarbyl having between one carbon atom and about 24 carbon atoms. The hydrocarbyl preferably comprises between about six carbon atoms and about 18 carbon atoms. The hydrocarbyl may be substituted or unsubstituted. Typical substituents include short carbon chain branching alkyl groups, typically having from one to four carbon atoms, i.e., methyl, ethyl, propyl, and butyl substituents and aromatic groups such as phenyl, napthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. In one preferred embodiment, only one of $R_1$, $R_2$, and $R_3$ is an unsubstituted hydrocarbyl and a straight chained alkyl, since a primary amine comprising a straight-chained alkyl better achieves a desirable densely packed self-assembled monolayer over a copper surface. Exemplary primary amines applicable for use in the composition of the present invention, singly or in combination, include aminoethane, 1-aminopropane, 2-aminopropane, 1-aminobutane, 2-aminobutane, 1-amino-2-methylpropane, 2-amino-2-methylpropane, 1-aminopentane, 2-aminopentane, 3-aminopentane, neo-pentylamine, 1-aminohexane, 1-aminoheptane, 2-aminoheptane, 1-aminooctane, 2-aminooctane, 1-aminononane, 1-aminodecane, 1-aminododecane, 1-aminotridecane, 1-aminotetradecane, 1-aminopentadecane, 1-aminohexadecane, 1-aminoheptadecane, and 1-aminooctadecane.

In a preferred embodiment, the organic functional group that interacts with and protects copper surfaces is an aromatic heterocycle comprising nitrogen. It is thought that aromatic heterocycles comprising nitrogen additionally protect copper surfaces by interacting with copper(I) ions on the surface of the copper conducting layer. Interaction with copper(I) ions forms a film comprising insoluble copper(I)-based organometallics that precipitate on the surface of the copper conducting layer. This precipitate is also thought to be another mechanism whereby amines, particularly heterocyclic, aromatic amines, form a protective organic film on the surface of the copper conducting layer.

Aromatic heterocycles comprising nitrogen suitable for the use in the composition of the present invention comprise nitrogen in a 5-membered ring (azoles). The 5-membered can be fused to another 5-membered or 6-membered aromatic ring, which can also be a heterocyclic ring comprising a nitrogen atom. Further, the aromatic heterocycle can comprise one or more nitrogen atoms, and typically, the aromatic heterocycle comprises between one and four nitrogen atoms. Azoles can have the following general structure (IV):

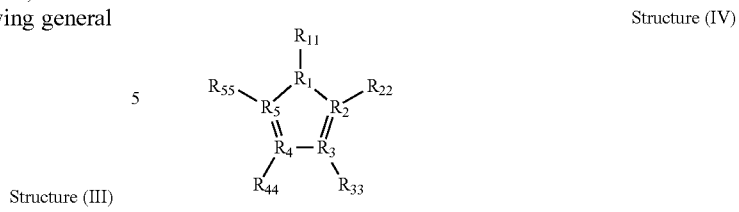

Structure (IV)

wherein each of $R_1$, $R_2$, $R_3$, $R_4$, and $R_5$ is an atom selected from the group consisting of carbon and nitrogen wherein between one and four of the $R_1$, $R_2$, $R_3$, $R_4$, and $R_5$ groups are nitrogen and between one and four of the $R_1$, $R_2$, $R_3$, $R_4$, and $R_5$ groups are carbon; and $R_{11}$, $R_{22}$, $R_{33}$, $R_{44}$, and $R_{55}$ are each independently selected from the group consisting of hydrogen, carbon, sulfur, oxygen, and nitrogen.

Any one or more of $R_{11}$, $R_{22}$, $R_{33}$, $R_{44}$, and $R_{55}$ of structure (I) may be carbon wherein the carbon is part of an aliphatic group having between one carbon atom and 24 carbon atoms or part of an aryl group having between two carbon atoms and fourteen carbon atoms. The aliphatic group and the aryl group may be substituted or unsubstituted. The aliphatic group may be branched-chained or straight-chained. Unless otherwise indicated, a substituted aliphatic group or substituted aryl group is substituted with at least one atom other than carbon, including moieties in which a carbon chain atom is substituted with a hetero atom such as nitrogen, oxygen, silicon, phosphorous, boron, sulfur, or a halogen atom. The aliphatic group or aryl may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters, and ethers.

In structure (IV), any pair of consecutive $R_{11}$, $R_{22}$, $R_{33}$, $R_{44}$, and $R_{55}$ (e.g., $R_{11}$ and $R_{22}$ or $R_{22}$ and $R_{33}$) can together with the carbon or nitrogen atoms to which they are bonded form a substituted or unsubstituted cycloalkyl or substituted or unsubstituted aryl group with the corresponding pair of consecutive $R_1$, $R_2$, $R_3$, $R_4$, and $R_5$ (e.g., $R_{11}$ and $R_{22}$ form a ring with $R_1$ and $R_2$) such that the ring defined by the $R_1$, $R_2$, $R_3$, $R_4$, and $R_5$ groups is fused to another ring. This ring may comprise one or two nitrogen atoms. Preferably, the consecutive $R_{11}$, $R_{22}$, $R_{33}$, $R_{44}$, and $R_{55}$ and the corresponding consecutive $R_1$, $R_2$, $R_3$, $R_4$, and $R_5$ form a six-membered aromatic ring.

In one embodiment, the azole of structure (IV) is not substituted. Exemplary unsubstituted azoles applicable for use in the composition of the present invention are shown in Table I. Preferred unsubstituted azoles include imidazole, triazole, pyrazole, benzimidazole, purine, imidazo[4,5-b]pyridine, and benzotriazole. Among these, benzimidazole is particularly preferred.

TABLE I

Azoles

| Name | Structure |
|---|---|
| Pyrrole (1H-azole) | |
| Imidazole (1,3-diazole) | |

TABLE I-continued

Azoles

| Name | Structure |
|---|---|
| Pyrazole (1,2-diazole) | |
| 1,2,3-triazole | |
| 1,2,4-triazole | |
| Tetrazole | |
| Isoindole | |
| Indole (1H-Benzo[b]pyrrole) | |
| Benzimidazole (1,3-benzodiazole) | |
| Indazole (1,2-benzodiazole) | |
| 1H-Benzotriazole | |
| 2H-Benzotriazole | |
| Imidazo[4,5-b]pyridine | |
| Purine (7H-Imidazo(4,5-d)pyrimidine) | |
| Pyrazolo[3,4-d]pyrimidine | |
| Triazolo[4,5-d]pyrimidine | |

In one embodiment, the azole of structure (IV) is a substituted azole. In one embodiment, the azole compound is a substituted imidazole, which has the following general structure (V):

Structure (V)

wherein $R_{22}$, $R_{44}$, and $R_{55}$ are as defined in connection with structure (IV).

In one embodiment, the azole compound is a 2-substituted imidazole, which has the following general structure (VI):

Structure (VI)

wherein $R_{22}$ is as defined in connection with structure (IV).

In one embodiment, the azole compound is a 2,4-substituted imidazole, which has the following general structure (VII):

Structure (VII)

Wherein $R_{55}$ may be hydrogen or methyl, and the various R groups may be hydrogen, alkyl, halide, alkoxy, alkylamino, cyano, and nitro. Preferably, the A groups are hydrogen or halide. The halide may be chloride, bromide, or iodide, and preferably, the halide is chloride.

In one embodiment, the azole compound is a benzimidazole derivative, which has the following general structure (VIII):

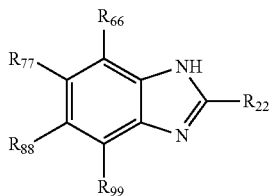

Structure (VIII)

wherein $R_{22}$ is as defined in connection with structure (IV); and $R_{66}$, $R_{77}$, $R_{88}$, and $R_{99}$ are independently selected from among hydrogen, halide, nitro, and substituted or unsubstituted hydrocarbyl, substituted or unsubstituted alkoxy, substituted or unsubstituted amino, and cyano.

In the context of structure (VIII), the halide may be selected from among chloride, bromide, and iodide. Preferably, the halide is chloride.

Moreover, the substituted or unsubstituted hydrocarbyl may be selected from among substituted or unsubstituted alkyl, substituted or unsubstituted alkenyl, substituted or unsubstituted alkynyl, and substituted or unsubstituted aryl. The substituted or unsubstituted hydrocarbyl typically has from one to about twenty five carbon atoms, more typically from one to about twelve carbon atoms, such as one to about seven carbon atoms. The hydrocarbyl may be methyl, ethyl, n-propyl, isopropyl, n-butyl, isobutyl, tert-butyl, a pentyl, a hexyl, a heptyl, phenyl, or benzyl. Typical substituents on substituted hydrocarbyl include nitro, amino, halide, cyano, carbonyl, carboxyl, hydroxyl, and alkoxy. A preferred substituent is halide, which may be chloride, bromide, or iodide. Preferably, the halide substituent is chloride.

Additionally, the substituted or unsubstituted alkoxy and substituted or unsubstituted amino typically have from one to about twenty five carbon atoms, more typically from one to about twelve carbon atoms, such as one to about six carbon atoms. Typical substituents on substituted alkoxy and substituted amine include nitro, amino, halide, cyano, carbonyl, carboxyl, hydroxyl, and alkoxy.

In one embodiment, the azole component is a 2-substituted benzimidazole, which has the following general structure (IX):

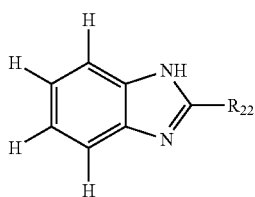

Structure (IX)

wherein $R_{22}$ is as defined in connection with structure (IV).

Exemplary substituted azoles include 2-(3,4-dichlorobenzyl)-benzimidazole; 2-bromobenzyl benzimidazole; 2-bromophenyl benzimidazole; 2-bromoethylphenyl benzimidazole; 2-chlorobenzyl benzimidazole; 2-chlorophenyl benzimidazole; and 2-chloroethylphenyl benzimidazole.

The molecule that comprises at least one organic functional group that interacts with and protects copper surfaces may be present in the composition at a concentration of at least about 0.1 g/L. The concentration is typically at or above this minimum concentration to achieve adequate coverage of the substrate for corrosion protection. Typically, the concentration of the molecule that comprises at least one organic functional group that interacts with and protects copper surfaces is at least about 1.0 g/L, more typically at least about 4.0 g/L. The molecule that comprises at least one organic functional group that interacts with and protects copper surfaces may be present in the composition at a concentration up to the solubility limit. Typically, the concentration of the molecule that comprises at least one organic functional group that interacts with and protects copper surfaces is at most about 10.0 g/L. Accordingly, the concentration of the molecule that comprises at least one organic functional group that interacts with and protects copper surfaces may be between about 0.1 g/L up to the solubility limit in the composition, typically between about 1.0 g/L and about 10 g/L, more typically between about 4.0 g/L and about 10 g/L.

The composition is preferably an aqueous solution comprising the organic molecules as described above. The composition of the present invention may further comprise an alcohol, a surfactant, and an alkaline pH adjuster.

Incorporating an alcohol in the composition enhances the solubility of the organic molecules. Applicable alcohols include alcohols, diols, triols, and higher polyols. Suitable alcohols include ethanol, propanol, isopropanol, n-butanol, isobutanol, tert-butanol, ethylene glycol, propane-1,2-diol, butane-1,2-diol, butane-1,3-diol, butane-1,4-diol, propane-1, 3-diol, hexane-1,4-diol hexane-1,5-diol, hexane-1,6-diol, 2-methoxyethanol, 2-ethoxyethanol, 2-propoxyethanol, 2-butoxyethanol, etc. Then there are unsaturated diols, such as butene-diol, hexene-diol, and acetylenics such as butyne diol. A suitable triol is glycerol. Additional alcohols include triethylene glycol, diethylene glycol, diethylene glycol methyl ether, triethylene glycol monomethyl ether, triethylene glycol dimethyl ether, propylene glycol, dipropylene glycol, allyl alcohol, furfuryl alcohol, and tetrahydrofurfuryl alcohol.

The alcohol may be present in the composition at a concentration of at least about 10 mL/L. Typically, the concentration of the alcohol is at least about 100 mL/L, more typically at least about 150 mL/L. The alcohol may be present in the composition at a concentration up to its solubility limit in water. It is within the scope of the invention to employ solvent systems comprised entirely of alcohol. In aqueous solvent systems wherein the alcohol is a supplementary solvent, the concentration of the alcohol is typically less than about 500 mL/L, more typically less than about 200 mL/L. Accordingly, the alcohol concentration may be between about 10 mL/L and about 500 mL/L, typically between about 150 mL/L and about 200 mL/L.

A surfactant may be added to enhance the wettability of the copper and silver surfaces. The surfactant may be cationic, anionic, non-ionic, or zwitterionic. A particular surfactant may be used alone or in combination with other surfactants. One class of surfactants comprises a hydrophilic head group and a hydrophobic tail. Hydrophilic head groups associated with anionic surfactants include carboxylate, sulfonate, sulfate, phosphate, and phosphonate. Hydrophilic head groups associated with cationic surfactants include quaternary amine, sulfonium, and phosphonium. Quaternary amines include quaternary ammonium, pyridinium, bipyridinium, and imidazolium. Hydrophilic head groups associated with non-ionic surfactants include alcohol and amide. Hydrophilic head groups associated with zwitterionic surfactants include betaine. The hydrophobic tail typically comprises a hydrocarbon chain. The hydrocarbon chain typically comprises between about six and about 24 carbon atoms, more typically between about eight to about 16 carbon atoms.

Exemplary anionic surfactants include alkyl phosphonates, alkyl ether phosphates, alkyl sulfates, alkyl ether sulfates, alkyl sulfonates, alkyl ether sulfonates, carboxylic acid ethers, carboxylic acid esters, alkyl aryl sulfonates, and sulfosuccinates. Anionic surfactants include any sulfate ester, such as those sold under the trade name ULTRAFAX, including, sodium lauryl sulfate, sodium laureth sulfate (2 EO), sodium laureth, sodium laureth sulfate (3 EO), ammonium lauryl sulfate, ammonium laureth sulfate, TEA-lauryl sulfate, TEA-laureth sulfate, MEA-lauryl sulfate, MEA-laureth sulfate, potassium lauryl sulfate, potassium laureth sulfate, sodium decyl sulfate, sodium octyl/decyl sulfate, sodium 2-ethylhexyl sulfate, sodium octyl sulfate, sodium nonoxynol-4 sulfate, sodium nonoxynol-6 sulfate, sodium cumene sulfate, and ammonoium nonoxynol-6 sulfate; sulfonate esters such as sodium α-olefin sulfonate, ammonium xylene sulfonate, sodium xylene sulfonate, sodium toluene sulfonate, dodecyl benzene sulfonate, and lignosulfonates; sulfosuccinate surfactants such as disodium lauryl sulfosuccinate, disodium laureth sulfosuccinate; and others including sodium cocoyl isethionate, lauryl phosphate, any of the ULTRAPHOS series of phosphate esters, Cyastat® 609 (N,N-Bis(2-hydroxyethyl)-N-(3'-Dodecyloxy-2'-Hydroxypropyl)Methyl Ammonium Methosulfate) and Cyastat® LS ((3-Lauramidopropyl)trimethylammonium methylsulfate), available from Cytec Industries.

Exemplary cationic surfactants include quaternary ammonium salts such as dodecyl trimethyl ammonium chloride, cetyl trimethyl ammonium salts of bromide and chloride, hexadecyl trimethyl ammonium salts of bromide and chloride, alkyl dimethyl benzyl ammonium salts of chloride and bromide, and the like. In this regard, surfactants such as Lodyne 106A (Fluoroalkyl Ammonium Chloride Cationic Surfactant 28-30%) and Ammonyx 4002 (Octadecyl dimethyl benzyl ammonium chloride Cationic Surfactant) are particularly preferred.

In a preferred embodiment, the surfactant is non-ionic. A class of non-ionic surfactants includes those comprising polyether groups, based on, for example, ethylene oxide (EO) repeat units and/or propylene oxide (PO) repeat units. These surfactants are typically non-ionic. Surfactants having a polyether chain may comprise between about 1 and about 36 EO repeat units, between about 1 and about 36 PO repeat units, or a combination of between about 1 and about 36 EO repeat units and PO repeat units. More typically, the polyether chain comprises between about 2 and about 24 EO repeat units, between about 2 and about 24 PO repeat units, or a combination of between about 2 and about 24 EO repeat units and PO repeat units. Even more typically, the polyether chain comprises between about 6 and about 15 EO repeat units, between about 6 and about 15 PO repeat units, or a combination of between about 6 and about 15 EO repeat units and PO repeat units. These surfactants may comprise blocks of EO repeat units and PO repeat units, for example, a block of EO repeat units encompassed by two blocks of PO repeat units or a block of PO repeat units encompassed by two blocks of EO repeat units. Another class of polyether surfactants comprises alternating PO and EO repeat units. Within these classes of surfactants are the polyethylene glycols, polypropylene glycols, and the polypropylene glycol/polyethylene glycols.

Yet another class of non-ionic surfactants comprises EO, PO, or EO/PO repeat units built upon an alcohol or phenol base group, such as glycerol ethers, butanol ethers, pentanol ethers, hexanol ethers, heptanol ethers, octanol ethers, nonanol ethers, decanol ethers, dodecanol ethers, tetradecanol ethers, phenol ethers, alkyl substituted phenol ethers, α-naphthol ethers, and β-naphthol ethers. With regard to the alkyl substituted phenol ethers, the phenol group is substituted with a hydrocarbon chain having between about 1 and about 10 carbon atoms, such as about 8 (octylphenol) or about 9 carbon atoms (nonylphenol). The polyether chain may comprise between about 1 and about 24 EO repeat units, between about 1 and about 24 PO repeat units, or a combination of between about 1 and about 24 EO and PO repeat units. More typically, the polyether chain comprises between about 8 and about 16 EO repeat units, between about 8 and about 16 PO repeat units, or a combination of between about 8 and about 16 EO and PO repeat units. Even more typically, the polyether chain comprises about 9, about 10, about 11, or about 12 EO repeat units; about 9, about 10, about 11, or about 12 PO repeat units; or a combination of about 9, about 10, about 11, or about 12 EO repeat units and PO repeat units.

An exemplary β-naphthol derivative non-ionic surfactant is Lugalvan BNO12 which is a β-naphtholethoxylate having 12 ethylene oxide monomer units bonded to the naphthol hydroxyl group. A similar surfactant is Polymax NPA-15, which is a polyethoxylated nonylphenol. Another surfactant is Triton®-X100 nonionic surfactant, which is an octylphenol ethoxylate, typically having around 9 or 10 EO repeat units. Additional commercially available non-ionic surfactants include the Pluronic® series of surfactants, available from BASF. Pluronic® surfactants include the P series of EO/PO block copolymers, including P65, P84, P85, P103, P104, P105, and P123, available from BASF; the F series of EO/PO block copolymers, including F108, F127, F38, F68, F77, F87, F88, F98, available from BASF; and the L series of EO/PO block copolymers, including L10, L101, L121, L31, L35, L44, L61, L62, L64, L81, and L92, available from BASF.

Additional commercially available non-ionic surfactants include water soluble, ethoxylated nonionic fluorosurfactants available from DuPont and sold under the trade name Zonyl®, including Zonyl® FSN (Telomar B Monoether with Polyethylene Glycol nonionic surfactant), Zonyl® FSN-100, Zonyl® FS-300, Zonyl® FS-500, Zonyl® FS-510, Zonyl® FS-610, Zonyl® FSP, and Zonyl® UR. Other non-ionic surfactants include the amine condensates, such as cocoamide DEA and cocoamide MEA, sold under the trade name ULTRAFAX. Other classes of nonionic surfactants include acid ethoxylated fatty acids (polyethoxy-esters) comprising a fatty acid esterified with a polyether group typically comprising between about 1 and about 36 EO repeat units. Glycerol esters comprise one, two, or three fatty acid groups on a glycerol base.

The surfactant may be present in the preferred composition at a concentration of at least about 0.01 g/L. Many surfactants provide effective wetting at very low concentrations. The minimum concentration may be adjusted to achieve adequate wetting, which depends in part on the identity of the surfactant. Typically, the surfactant concentration is at least about 0.1 g/L, more typically at least about 0.5 g/L. The surfactant may be present in the anti-corrosion composition at a concentration of less than about 10.0 g/L. Typically, the surfactant concentration is less than about 5.0 g/L, more typically less than about 2.0 g/L.

The composition of the present invention preferably has a pH between about 1.0 and about 12.0, typically between about 7.0 and about 11.0. The composition is preferably alkaline because in alkaline solution, the formation of the protective organic coating is more rapid than its formation in acidic solution. Alkaline adjustment may be accomplished using alkaline pH adjusting agents, such as sodium hydroxide, potassium hydroxide, hydroxides of quaternary amines, such as tetramethylammonium hydroxide, tetraethylammonium hydroxide, and the like. Typically, the concentration of the alkaline pH adjuster is sufficient to achieve the desired alkaline pH and may be between about 0.01 g/L and about 10.0 g/L, typically between about 0.01 g/L and about 2.0 g/L, more typically between about 0.1 g/L and about 0.5 g/L.

In one particularly preferred embodiment, the composition contains no alkali metal hydroxide, and only an alternative agent such as sodium tetra borate is used for pH adjustment.

Another aspect of the present invention is directed to a method of enhancing the corrosion resistance of a solderable copper substrate having a precious metal coating on a surface thereof. The method involves exposing the copper substrate having the precious metal coating on a surface thereof to a composition comprising a molecule comprising at least one organic functional group interacts with and protects copper surfaces and a molecule comprising at least one organic functional group interacts with and protects precious metal surfaces.

In one embodiment, the precious metal coating comprises silver. The silver coating layer may be deposited on the copper substrate by an immersion-plated silver coating method known in the art. For example, the method of coating a copper substrate with immersion-plated silver described in U.S. Pub. No. 2006/0024430, herein incorporated by reference in its entirety, is applicable. Commercially available chemistries for immersion silver coating include AlphaSTAR®, available from Enthone Inc. (West Haven, Conn.).

In one embodiment, the precious metal coating comprises gold. The gold coating layer may be deposited on the copper substrate by an immersion-plated gold coating method known in the art. Typically, the immersion-plated gold coating is deposited over a base metal underlayer, that is deposited directly on the copper substrate. Typical base metal underlayers include nickel layers and cobalt layers, each of which may be deposited by electroless deposition. For example, a commercially available chemistry for depositing an immersion gold coating on electroless nickel underlayer is SEL-REX® Select, available from Enthone Inc. (West Haven, Conn.).

The composition may be applied to the substrate in any manner sufficient to achieve adequate coverage of the substrate surface. By adequate, it is meant that the method of exposure ensures that areas of bare copper are covered with the composition, for example, copper-silver interfaces at high aspect ratio blind vias and plated through holes in PCB substrates having immersion silver finishes and pores that may be present in the immersion silver coating. Adequate coverage ensures that the molecules in the composition can interact with bare copper surfaces and precious metal surfaces in a manner sufficient to form protective organic film over the copper and precious metal surfaces. Exposure may be by flooding, dip, cascade, or spraying. Typical exposure times may be at least about 10 seconds, such as between about 30 seconds and about 120 seconds, or between about 30 seconds and about 60 seconds. Accordingly, the method of the present invention achieves rapid substrate coating. The temperature of the composition may vary between room temperature up to about 55° C., such as between about 20° C. and about 45° C. or between about 25° C. and about 45° C. To enhance exposure of bare copper areas to the coating, exposure may be accompanied by, for example, scrubbing, brushing, squeegeeing, agitation, stirring, etc. After exposing the copper substrate to the composition, the substrate may be rinsed, typically with deionized water for between about 10 seconds to about 2 minutes.

Another aspect of the present invention is directed to a protective organic film applied over an immersion-plated silver coating deposited on a solderable copper substrate. Exposure of the copper substrate having an immersion-plated silver coating thereon to the composition of the present invention results in a protective organic film on both the silver surfaces and exposed copper surfaces. The protective organic film comprises both the molecule comprising at least one organic functional group which interacts with and protects copper surfaces and the molecule comprising at least one organic functional group which interacts with and protects silver surfaces. A depiction of this protective organic film is shown in FIG. 1, in which the functional groups of the molecules that constitute the protective organic film are shown interacting with both the copper substrate and the immersion silver coating, e.g., the azole interacts with and protects the copper surface and the mercaptan group interacts with and protects the silver layer.

The molecules interact with and form a protective organic film over the copper and precious metal surfaces by self-assembled adsorption. Accordingly, the molecules self-assemble into a monolayer on the copper and silver surfaces. Accordingly, the protective organic film is a relatively dense, hydrophobic film that can provide enhanced protection against atmospheric moisture, which in turn, enhances the immersion silver coating's resistance to corrosion and sulfidation.

The protective organic film of the present invention may be additionally characterized by high thermal stability, particularly to temperatures commonly reached during lead-free reflow. The protective organic coatings of the present invention can better withstand reflow temperatures compared to conventional organic coatings (such as OSP) as shown by differential scanning calorimetry and thermogravimetric analysis. For example, a protective organic coating is stable at temperatures as high as about 254° C., while only 5% of the film is lost at temperatures as high as 274° C. This compares favorably to typical reflow temperatures for tin-lead eutectic solder which is typically reflowed at temperatures between about 230° C. and about 240° C. Moreover, the protective organic coating can withstand multiple lead-free reflow processes.

Finally, the protective organic coating has been observed to not negatively impact visual appearance and the solderability of the copper substrate. Solderability is shown by wetting balance testing and contact resistance.

Having described the invention in detail, it will be apparent that modifications and variations are possible without departing from the scope of the invention defined in the appended claims.

EXAMPLE 1

Immersion Silver Plating over a Copper Substrate

A copper cladded FR-4 laminate substrate was plated with a layer of immersion silver using AlphaSTAR® chemistry (available from Enthone Inc., West Haven, Conn.). The copper cladded FR-4 laminate substrate was dipped in an immersion silver plating bath comprising:

Silver ions (3.0 g/L)
AlphaSTAR® additives (300 mL/L)
Balance water.

The copper cladded FR-4 laminate substrate was dipped in the immersion silver plating bath for three minutes to deposit thin silver layers over the copper cladding, the silver layers having an approximate thickness of about 0.2 μm. A photograph of the freshly silver-plated laminate substrate is shown in FIG. 2A. The photograph shows a lustrous silver coating.

EXAMPLE 2

Hydrogen Sulfide Porosity Testing of Immersion-Plated Silver Coating on a Copper Substrate The freshly silver-plated copper cladded FR-4 laminate substrate of Example 1 was subjected to a porosity test in a sulfidizing atmosphere for ten minutes. In this test, the substrate is exposed to two ambient atmospheres, each comprising a sulfur-containing gas. In a first glass desiccator (150 mm inner diameter), an $SO_2$ vapor is evolved by placing a beaker containing 150 mL of a 6% solution of sulfurous acid therein and sealing the desiccator. In a second glass desiccator (150 mm inner diameter), an $H_2S$ vapor is evolved by placing a beaker containing 1 mL of a 23.5% solution of $(NH_4)_2S$ in 100 mL distilled water therein and sealing the desiccator. The test is carried out by placing the laminate substrate in the desiccator comprising $SO_2$ vapor first for 24 hours and then placing the laminate substrate in the desiccator comprising $H_2S$ vapor.

Figure 2B:
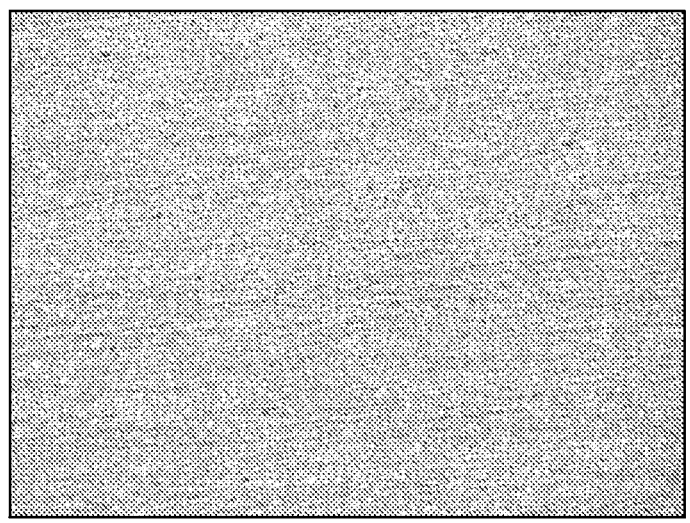
Figure 2C:
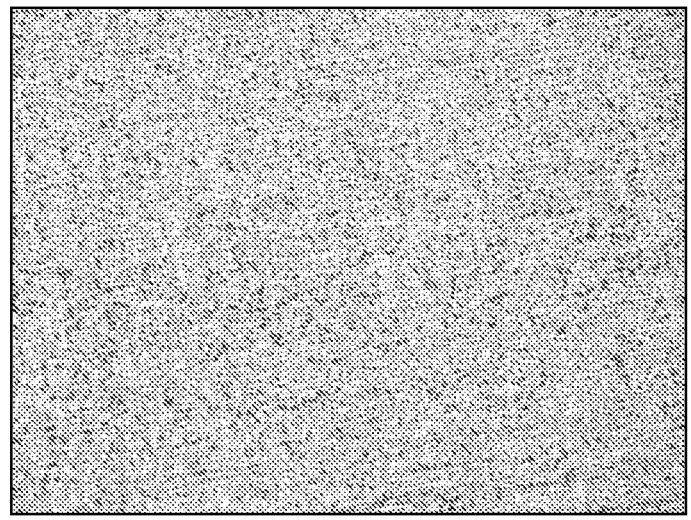
Figure 2D:

Photographs of the laminate substrate were taken after two minutes (FIG. 2B) of $H_2S$ exposure, after five minutes (FIG. 2C) of $H_2S$ exposure, and after ten minutes (FIG. 2D) of $H_2S$ exposure. The copper in the laminate substrate became increasingly discolored due to the formation of silver sulfides $(AgS_x)$, copper oxides $(CuO_x)$, and copper sulfides $(CuS_x)$. It is apparent, therefore, that a self-limiting immersion-plated silver coating may not be sufficient to protect copper from corrosion.

EXAMPLE 3

Applying a Protective Organic Coating Comprising a Mercaptan Compound to an Immersion-Plated Silver Coating on a Copper Substrate Three copper cladded FR-4 laminate substrates were plated using the AlphaSTAR® chemistry according to the method shown in Example 1. The copper cladded FR-4 laminate substrates were dipped in a commercially available post-treating composition comprising a mercaptan compound. The post-treating composition was Evabrite WS® (available from Enthone Inc., West Haven, Conn.) The post-treating composition comprised the following components:

1% wt./vol. Evabrite WS® additives

Balance water.

The laminate substrates were dipped according to the parameters shown in Table II. After dipping, the relative atomic % of each of the elements silver, carbon, oxygen, and sulfur on the surface of the silver-plated laminate substrates coated with Evabrite WS® were determined by X-ray photoelectron spectroscopy. The results are shown in Table III.

TABLE II

| | Dipping Parameters | |
|---|---|---|
| Laminate Substrate Number | Temperature | Duration |
| 1 | 25° C. | 30 seconds |
| 2 | 25° C. | 5 minutes |
| 3 | 50° C. | 30 seconds |

TABLE III

Atomic % of Ag, C, O, and S on the Surface Of the Silver-Coated Laminate Substrates

| Laminate Substrate | Relative Atomic % of Element | | | |
|---|---|---|---|---|
| Number | Ag | C | O | S |
| As Plated | 52.9 | 34.1 | 13 | 0 |
| 1 | 37.6 | 54.3 | 6.5 | 1.5 |
| 2 | 30.9 | 60.7 | 6.9 | 1.5 |
| 3 | 23.4 | 72.6 | 1.5 | 2.6 |

Surface coverage, according to the relative atomic % of sulfur and carbon, of mercaptan was not substantially increased by increasing dipping time from 30 seconds to 5 minutes. Moreover, dipping for five minutes did not lead to an appreciable reduction in surface oxygen compared to dipping for 30 seconds. Accordingly, an effective mercaptan coating can be applied in as little as 30 seconds.

Surface coverage increased by at least 50%, as measured by relative atomic % of sulfur, when the silver-plated laminate substrate was dipped in the Evabrite WS® composition at 50° C. Moreover, the surface oxygen atomic % was substantially reduced when the laminate substrate was dipped in the composition at 50° C. Without being bound to a particular theory, it is thought that the higher temperature catalyzed the formation of the mercaptan self-assembled monolayer over the silver coating. That is, the higher temperature catalyzed the formation of chemical bonds between silver atoms and sulfur and catalyzed bond breaking between silver atoms and oxygen. Moreover, it is thought that the higher temperatures reduces the composition's surface tension, which effects better wetting and thus better penetration by the mercaptan molecules into silver pores. With better pore penetration, it may be concluded that the mercaptan more effectively blocks the migration of copper atoms through the silver pores and inhibits copper oxidation.

EXAMPLE 4

Figure 3A:
FIGS. 3A and 3B are photographs of immersion silver-plated copper coupons subjected to porosity testing according to the method of Example 4.
Figure 3B:

Hydrogen Sulfide Porosity Testing of Non-Coated Silver-Plated Laminate Substrate and Mercaptan-Coated Silver-Plated Laminate Substrate To determine the effectiveness of using Evabrite WS® compositions for protecting silver-plated laminate substrate against corrosion, Laminate Substrate 1 from Example 3 and a freshly silver-plated Laminate Substrate plated according to the method of Example 1 with no post-treatment were subjected to a $H_2S$ porosity test for ten minutes, as described above in Example 2. A photograph of the untreated silver-plated laminate substrate is shown in FIG. 3A, and the Evabrite WS®-treated silver-plated laminate substrate is shown in FIG. 3B. The Evabrite WS®-treated silver-plated laminate substrate retained its lustrous silver color while the untreated silver-plated laminate substrate became tarnished and discolored.

EXAMPLE 5

Post-Treatment Composition Comprising a Compound Comprising a Mercaptan Functional Group A post-treating composition was prepared having the following components:

0.08% wt./vol. 1-octadecanethiol

Balance water.

EXAMPLE 6

Post-Treating Composition Comprising a Compound Comprising an Aromatic Heterocycle Comprising Nitrogen A post-treating composition was prepared having the following components:
0.09% wt./vol. 2-(3,4-dichlorobenzyl)-benzimidazole
Balance water.

EXAMPLE 7

Post-Treating Composition Comprising a Compound Comprising an Aromatic Heterocycle Comprising Nitrogen and a Compound Comprising a Mercaptan Functional Group A post-treating composition was prepared having the following components:
1% wt./vol. Evabrite WS® additives
0.09% wt./vol. 2-(3,4-dichlorobenzyl)-benzimidazole
Balance water.

EXAMPLE 8

Hydrogen Sulfide Porosity Testing of Untreated and Post-Treated Silver-Plated Copper Coupons Several immersion silver plated copper cladded FR-4 laminate substrates were subjected to an $H_2S$ porosity test (45 minutes exposure to $H_2S$ vapor), as described above in Example 2. The immersion silver plated copper cladded FR-4 laminate substrates were either left untreated or post-treated with the compositions described in Examples 3, 5, 6, and 7. Table IV shows the coupons identified by the post-treatment composition according to Example Number and the appearance of the coupons after the 45 minute $H_2S$ porosity test. Photographs (FIG. 4A to 4F) were taken of each coupon after the 45 minute $H_2S$ porosity test.

TABLE IV

| Number | Post-Treatment Composition | Appearance | FIG. 4 |
|---|---|---|---|
| 4 | Untreated | Dark Blue | A |
| 5 | Example 6 | Brown/Blue | B |
| 6 | Example 3, coupon 1 | Brown | C |
| 7 | Example 5 | Slightly Brown | D |
| 8 | Example 7 | No tarnishing | E |
| 9 | Example 3, coupon 3 | No tarnishing | F |

Figure 4A:
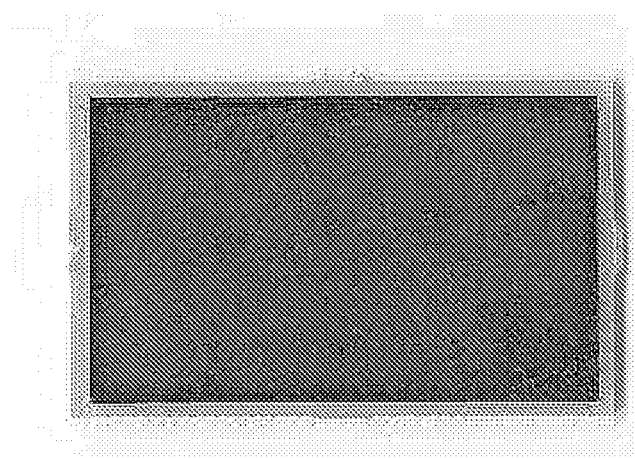
FIGS. 4A through 4F are photographs of immersion silver-plated copper coupons subjected to porosity testing according to the method of Example 8.
Figure 4B:
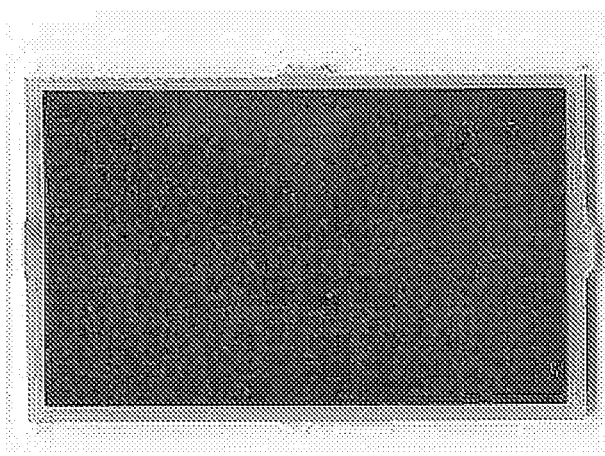
Figure 4C:
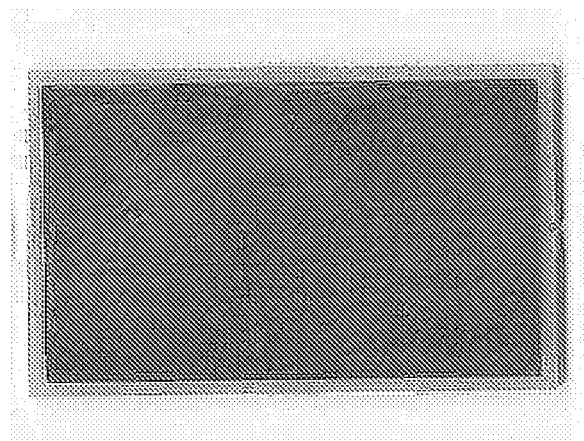
Figure 4D:
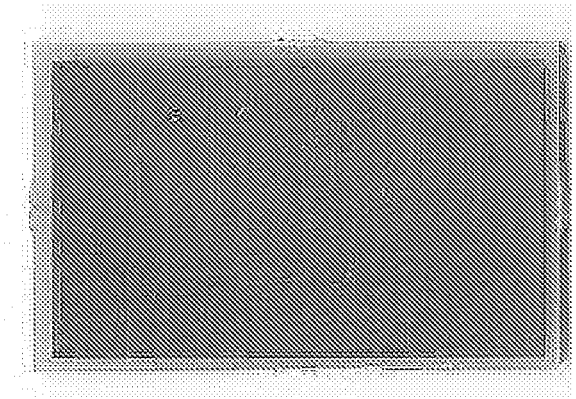
Figure 4E:
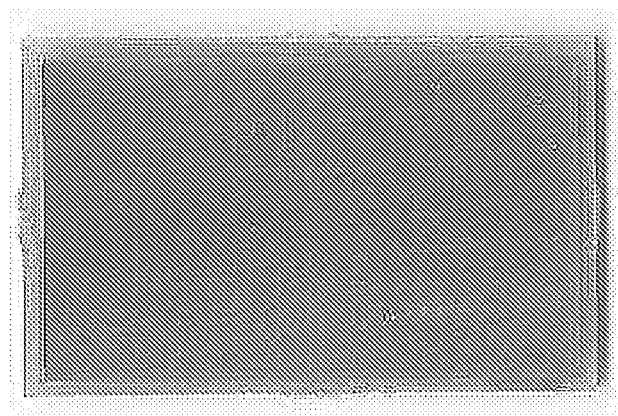
Figure 4F:
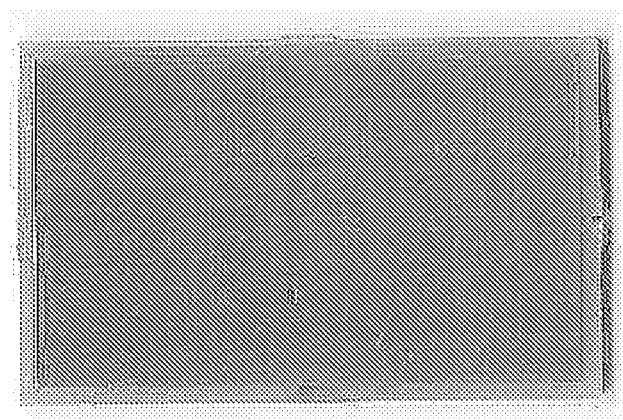

Coupons 8 and 9, depicted in FIGS. 4E and 4F, showed little or no tarnishing even after 45 minutes of exposure to $H_2S$. Accordingly, post-treating methods involving applying a mercaptan at elevated temperatures or applying a mercaptan and an aromatic heterocycle comprising nitrogen are effective means for inhibiting tarnishing even under highly corrosive environmental conditions.

EXAMPLE 9

Figure 5A:
FIGS. 5A through 5E are photographs of immersion silver-plated copper coupons subjected to porosity testing according to the method of Example 9.
Figure 5B:
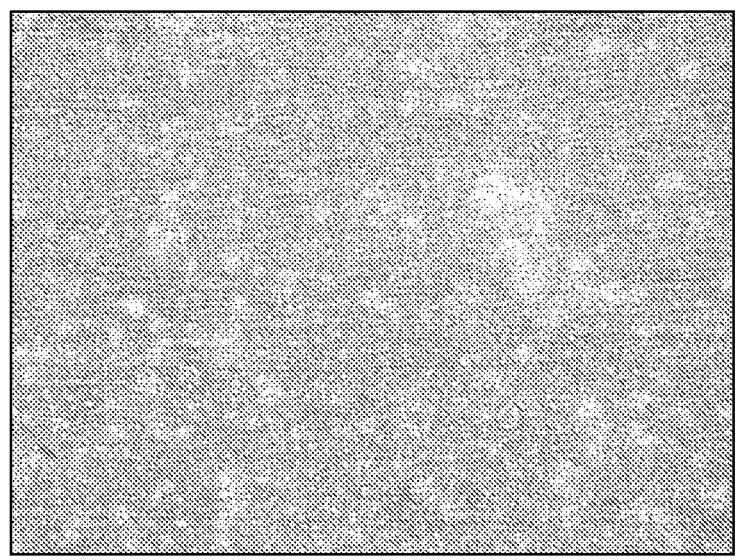
Figure 5C:
Figure 5D:
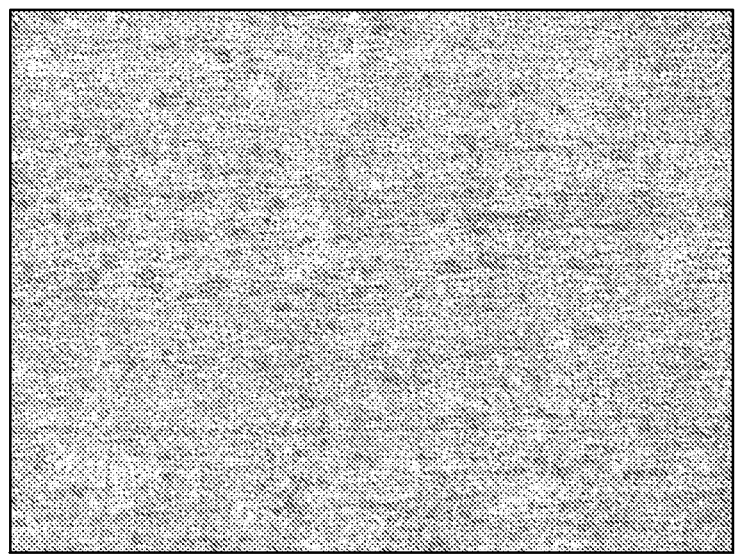
Figure 5E:
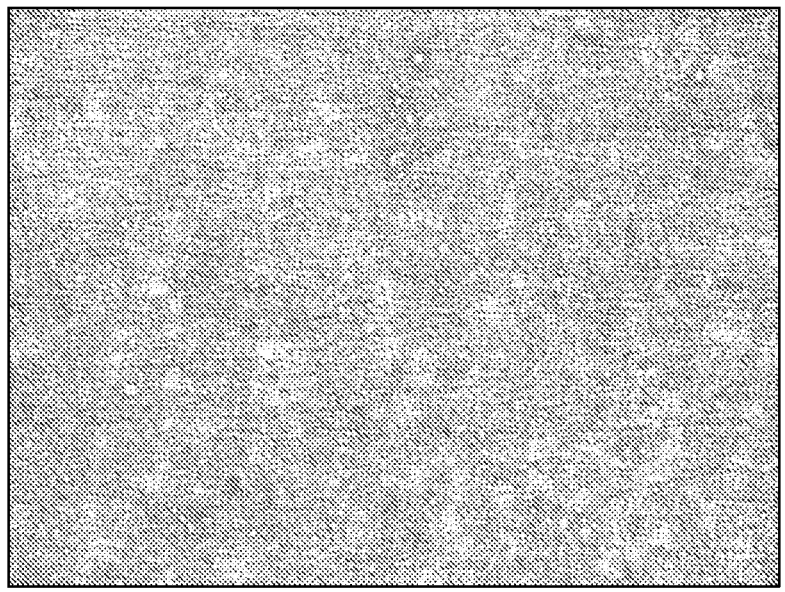

Bake Testing after Hydrogen Sulfide Porosity Testing of Untreated and Post-Treated Silver-Plated Copper Coupons Six immersion silver plated copper cladded FR-4 laminate substrates were either untreated or post-treated in the same manner as coupons 4-9 in Example 8. The six immersion silver plated copper cladded FR-4 laminate substrates were subjected to an $H_2S$ porosity test (45 minutes exposure to $H_2S$ vapor) followed by baking at 5 minutes at 250 to 257° C. Photographs (FIG. 5A to 5E) were taken of each laminate substrate after this treatment. The laminate substrate depicted in FIG. 5D, which was treated with mercaptan and an aromatic heterocycle comprising nitrogen exhibited the least tarnishing/corrosion compared to the other post-treatments.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. For example, that the foregoing description and following claims refer to "a" layer means that there can be one or more such layers. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

We claim:

1. A method for enhancing the corrosion resistance of a surface of a copper or copper alloy substrate, the method comprising:
    depositing a metallic surface layer comprising a precious metal on the surface of the copper or copper alloy substrate; and
    exposing the copper or copper alloy substrate having the metallic surface layer thereon to an aqueous composition comprising (a) a first organic molecule comprising at least one functional group that interacts with and protects precious metal surfaces, (b) a second organic molecule comprising at least one functional group that interacts with and protects copper surfaces, wherein said second organic molecule is selected from the group consisting of aminoethane, 1-aminopropane, 2-aminopropane, 1-aminobutane, 2-aminobutane, 1-amino-2-methylpropane, 2-amino-2-methylpropane, 1-aminopentane, 2-aminopentane, 3-aminopentane, neo-pentylamine, 1-aminohexane, 1-aminoheptane, 2-aminoheptane, 1-aminooctane, 2-aminooctane, 1-aminononane, 1-aminodecane, 1-aminododecane, 1-aminotridecane, 1-aminotetradecane, 1-aminopentadecane, 1-aminohexadecane, 1-aminoheptadecane, 1-aminooctadecane, and combinations thereof.

2. A method for enhancing the corrosion resistance of a surface of a copper or copper alloy substrate, the method comprising:
    depositing a metallic surface layer comprising a precious metal on the surface of the copper or copper alloy substrate; and
    exposing the copper or copper alloy substrate having the metallic surface layer thereon to an aqueous composition comprising (a) a first organic molecule comprising at least one functional group that interacts with and protects precious metal surfaces, (b) a second organic molecule comprising at least one functional group that interacts with and protects copper surfaces, wherein the second organic molecule is an azole having the following general structure (IV):

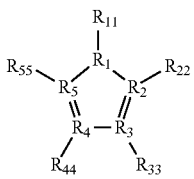
Structure (IV)

wherein each of $R_1$, $R_2$, $R_3$, $R_4$, and $R_5$ is an atom selected from the group consisting of carbon and nitrogen wherein between one and four of the $R_1$, $R_2$, $R_3$, $R_4$, and $R_5$ groups are nitrogen and between one and four of the $R_1$, $R_2$, $R_3$, $R_4$, and $R_5$ groups are carbon; and: (i) $R_{11}$, $R_{22}$, $R_{33}$, $R_{44}$, and $R_{55}$ are each independently selected from the group consisting of hydrogen, carbon, sulfur, oxygen, and nitrogen; or (ii) a pair of consecutive $R_{11}$, $R_{22}$, $R_{33}$, $R_{44}$, and $R_{55}$ groups together with the carbon or nitrogen atoms to which they are bonded form a substituted or unsubstituted cycloalkyl or substituted or unsubstituted aryl group with the corresponding pair of consecutive $R_1$, $R_2$, $R_3$, $R_4$, and $R_5$ groups to form a ring that is fused to the azole ring.

3. The method of claim 2 wherein the azole is selected from the group consisting of pyrrole (1H-azole); imidazole (1,3-diazole); pyrazole (1,2-diazole); 1,2,3-triazole; 1,2,4-triazole; tetrazole; isoindole; indole (1H-benzo[b]pyrrole); benzimidazole (1,3-benzodiazole); indazole (1,2-benzodiazole); 1H-benzotriazole; 2H-benzotriazole; imidazo[4,5-b]pyridine; purine (7H-imidazo[4,5-d]pyrimidine); pyrazolo[3,4-d]pyrimidine; triazolo[4,5-d]pyrimidine; and combinations thereof.

4. The method of claim 2 wherein the azole is selected from the group consisting of 2-(3,4-dichlorobenzyl)-benzimidazole; 2-bromobenzyl benzimidazole; 2-bromophenyl benzimidazole; 2-bromoethylphenyl benzimidazole; 2-chlorobenzyl benzimidazole; 2-chlorophenyl benzimidazole; 2-chloroethylphenyl benzimidazole; and combinations thereof.

5. A method of claim 1 for enhancing the corrosion resistance of a surface of a copper or copper alloy substrate, the method comprising:
  depositing a metallic surface layer comprising a precious metal on the surface of the copper or copper alloy substrate; and
  exposing the copper or copper alloy substrate having the metallic surface layer thereon to an aqueous composition comprising (a) a first organic molecule comprising at least one functional group that interacts with and protects precious metal surfaces, (b) a second organic molecule comprising at least one functional group that interacts with and protects copper surfaces, and (c) a surfactant, said first organic molecule being present in a concentration between about 1 and about 10 g/L and said second organic molecule being present in a concentration between about 1 and about 10 g/L.

6. The method of claim 5 wherein the metallic surface layer is deposited by an immersion displacement plating process, and the metallic surface layer comprises silver, gold, or a combination thereof.

7. The method of claim 5 wherein the first organic molecule is selected from the group consisting of thiols (mercaptans), disulfides, thioethers, thioaldehydes, thioketones, and combinations thereof.

8. The method of claim 5 wherein the second organic molecule is selected from the group consisting of primary amines, secondary amines, tertiary amines, aromatic heterocycles comprising nitrogen, and combinations thereof.

9. A method for enhancing the corrosion resistance of a surface of a copper or copper alloy substrate, the method comprising:
  depositing a metallic surface layer comprising a precious metal on the surface of the copper or copper alloy substrate; and
  exposing the copper or copper alloy substrate having the metallic surface layer thereon to an aqueous composition comprising (a) a first organic molecule comprising at least one functional group that interacts with and protects precious metal surfaces, said first organic molecule being selected from the group consisting of: (i) a thiol having the following general structure (I):

Structure (I)

wherein $R_1$ is either a hydrocarbyl having between one carbon atom and about 24 carbon atoms or an aryl having between about five and about fourteen carbon atoms; and (ii) a disulfide having the following structure (II):

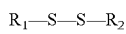
Structure (II)

wherein $R_1$ and $R_2$ are each independently either a hydrocarbyl having between one carbon atom and about 24 carbon atoms or an aryl having between about five and about fourteen carbon atoms; (b) a second organic molecule comprising at least one functional group that interacts with and protects copper surfaces; and (c) a surfactant.

10. A method as set forth in claim 9 wherein said second organic molecule is selected from the group consisting of: (i) a primary amine, secondary amine, or a tertiary amine having the following general structure (III):

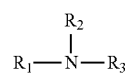
Structure (III)

wherein $R_1$, $R_2$, and $R_3$ are each independently hydrogen or a hydrocarbyl having between one carbon atom and about 24 carbon atoms, and at least one of $R_1$, $R_2$, and $R_3$ is a hydrocarbyl having between one carbon atom and about 24 carbon atoms; and (ii) an azole having the following general structure (IV):

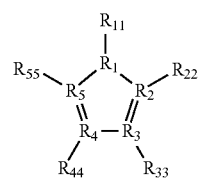
Structure (IV)

wherein each of $R_1$, $R_2$, $R_3$, $R_4$, and $R_5$ is an atom selected from the group consisting of carbon and nitrogen wherein between one and four of the $R_1$, $R_2$, $R_3$, $R_4$, and $R_5$ groups are nitrogen and between one and four of the $R_1$, $R_2$, $R_3$, $R_4$, and $R_5$ groups are carbon; and: (i) $R_{11}$, $R_{22}$, $R_{33}$, $R_{44}$, and $R_{55}$ are each independently selected from the group consisting of hydrogen, carbon, sulfur, oxygen, and nitrogen; or (ii) a pair of consecutive $R_{11}$, $R_{22}$, $R_{33}$, $R_{44}$, and $R_{55}$ groups together with the carbon or nitrogen atoms to which they are bonded form a substituted or unsubstituted cycloalkyl or substituted or unsubstituted aryl group with the corresponding pair of consecutive $R_1$, $R_2$, $R_3$, $R_4$, and $R_5$ groups to form a ring that is fused to the azole ring.

11. The method of claim 9 wherein the first organic molecule is a thiol having the following general structure (I):

$$R_1-S-H \qquad \text{Structure (I)}$$

wherein $R_1$ is either a hydrocarbyl having between one carbon atom and about 24 carbon atoms or an aryl having between about five and about fourteen carbon atoms.

12. The method of claim 11 wherein the thiol is selected from the group consisting of ethanethiol; 1-propanethiol; 2-propanethiol; 2-propene-1-thiol; 1-butanethiol; 2-butanethiol; 2-methyl-1-propanethiol; 2-methyl-2-propanethiol; 2-methyl-1-butanethiol; 1-pentanethiol; 2,2-dimethyl-1-propanethiol; 1-hexanethiol; 1,6-hexanedithiol; 1-heptanethiol; 2-ethylhexanethiol; 1-octanethiol; 1,8-octanedithiol; 1-nonanethiol; 1,9-nonanedithiol; 1-decanethiol; 1-adamantanethiol; 1,11-undecanedithiol; 1-undecanethiol; 1-dodecanethiol; tert-dodecylmercaptan; 1-tridecanethiol; 1-tetradecanethiol; 1-pentadecanethiol; 1-hexadecanethiol; 1-heptadecanethiol; 1-octadecanethiol; 1-nonadecanethiol; and 1-icosanethiol; and combinations thereof.

13. The method of claim 11 wherein the thiol is selected from the group consisting of benzenethiol; 2-methylbenzenethiol; 3-methylbenzenethiol; 4-methylbenzenethiol; 2-ethylbenzenethiol; 3-ethylbenzenethiol; 4-ethylbenzenethiol; 2-propylbenzenethiol; 3-propylbenzenethiol; 4-propylbenzenethiol; 2-tert-butylbenzenethiol; 4-tert-butylbenzenethiol; 4-pentylbenzenethiol; 4-hexylbenzenethiol; 4-heptylbenzenethiol; 4-octylbenzenethiol; 4-nonylbenzenethiol; 4-decylbenzenethiol; benzyl mercaptan; 2,4-xylenethiol, furfuryl mercaptan; 1-naphthalenethiol; 2-naphthalenethiol; 4,4'-dimercaptobiphenyl; and combinations thereof.

14. The method of claim 9 wherein the first organic molecule is a disulfide having the following structure (II):

$$R_1-S-S-R_2 \qquad \text{Structure (II)}$$

wherein $R_1$ and $R_2$ are each independently either a hydrocarbyl having between one carbon atom and about 24 carbon atoms or an aryl having between about five and about fourteen carbon atoms.

15. The method of claim 14 wherein the disulfide is selected from the group consisting of diethyl disulfide, di-n-propyl disulfide, diisopropyl disulfide, diallyl disulfide, di-n-butyl disulfide, di-sec-butyl disulfide, diisobutyl disulfide, di-tert-butyl disulfide, di-n-pentyl disulfide, di-neopentyl disulfide, di-n-hexyl disulfide, di-n-heptyl disulfide, di-n-octyl disulfide, di-n-nonyl disulfide, di-n-decyl disulfide, di-n-dodecyl disulfide, di-n-tridecyl disulfide, di-n-tetradecyl disulfide, di-n-pentadecyl disulfide, di-n-hexadecyl disulfide, di-n-heptadecyl disulfide, di-n-octadecyl disulfide, di-n-decyl disulfide; diundecyl disulfide, didodecyl disulfide, dihexadecyl disulfide, dibenzyl disulfide, dithienyl disulfide, 2-naphthyl disulfide, and combinations thereof.

16. A method for enhancing the corrosion resistance of a surface of a copper or copper alloy substrate, the method comprising:

depositing a metallic surface layer comprising a precious metal on the surface of the copper or copper alloy substrate; and exposing the copper or copper alloy substrate having the metallic surface layer thereon to an aqueous composition comprising (a) a first organic molecule comprising at least one functional group that interacts with and protects precious metal surfaces, said first molecule being selected from the group consisting of thiols (mercaptans), disulfides, thioethers, thioaldehydes, thioketones, and combinations thereof, (b) a second organic molecule comprising at least one functional group that interacts with and protects copper surfaces, and (c) a surfactant.

* * * * *

UNITED STATES PATENT AND TRADEMARK OFFICE
CERTIFICATE OF CORRECTION

PATENT NO. : 8,703,243 B2  
APPLICATION NO. : 13/176411  
DATED : April 22, 2014  
INVENTOR(S) : Joseph A. Abys, Shenliang Sun and Theodore Antonellis Page 1 of 1

It is certified that error appears in the above-identified patent and that said Letters Patent is hereby corrected as shown below:

In the Claims

Column 21, Claim 5, Line 41:
 "A method of claim 1 for enhancing the corrosion"

Should read
 -- A method for enhancing the corrosion --

Signed and Sealed this
Sixth Day of January, 2015

Michelle K. Lee
*Deputy Director of the United States Patent and Trademark Office*